(12) United States Patent
Chuang et al.

(10) Patent No.: US 9,196,611 B2
(45) Date of Patent: Nov. 24, 2015

(54) REDUCED SUBSTRATE COUPLING FOR INDUCTORS IN SEMICONDUCTOR DEVICES

(71) Applicants: Harry Hak-Lay Chuang, Crescent (SG); Ming Zhu, Singapore (SG); Lee-Wee Teo, Singapore (SG)

(72) Inventors: Harry Hak-Lay Chuang, Crescent (SG); Ming Zhu, Singapore (SG); Lee-Wee Teo, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/250,519

(22) Filed: Apr. 11, 2014

(65) Prior Publication Data

US 2014/0203375 A1     Jul. 24, 2014

Related U.S. Application Data

(62) Division of application No. 12/724,904, filed on Mar. 16, 2010, now Pat. No. 8,697,517.

(51) Int. Cl.
| | |
|---|---|
| *H01L 31/119* | (2006.01) |
| *H01L 27/06* | (2006.01) |
| *H01L 23/522* | (2006.01) |
| *H01L 27/02* | (2006.01) |
| *H01L 27/08* | (2006.01) |

(52) U.S. Cl.
CPC ........ *H01L 27/0617* (2013.01); *H01L 23/5227* (2013.01); *H01L 27/0207* (2013.01); *H01L 27/08* (2013.01)

(58) Field of Classification Search
CPC ............................ H01L 28/10; H01L 23/5227
USPC ......................................... 257/379, 380, 368
See application file for complete search history.

(56) References Cited

U.S. PATENT DOCUMENTS

| | | | |
|---|---|---|---|
| 6,114,206 A * | 9/2000 | Yu ................................. | 438/270 |
| 6,258,677 B1 | 7/2001 | Ang et al. | |
| 6,271,083 B1 | 8/2001 | Lou | |
| 6,406,956 B1 | 6/2002 | Tsai et al. | |
| 6,794,721 B2 | 9/2004 | Clevenger et al. | |
| 8,227,870 B2 | 7/2012 | Chudzik et al. | |
| 2011/0227167 A1 | 9/2011 | Chuang et al. | |

* cited by examiner

*Primary Examiner* — Samuel Gebremariam
(74) *Attorney, Agent, or Firm* — Haynes and Boone, LLP

(57) ABSTRACT

The present disclosure provides reduced substrate coupling for inductors in semiconductor devices. A method of fabricating a semiconductor device having reduced substrate coupling includes providing a substrate having a first region and a second region. The method also includes forming a first gate structure over the first region and a second gate structure over the second region, wherein the first and second gate structures each include a dummy gate. The method next includes forming an inter layer dielectric (ILD) over the substrate and forming a photoresist (PR) layer over the second gate structure. Then, the method includes removing the dummy gate from the first gate structure, thereby forming a trench and forming a metal gate in the trench so that a transistor may be formed in the first region, which includes a metal gate, and an inductor component may be formed over the second region, which does not include a metal gate.

20 Claims, 9 Drawing Sheets

REDUCED SUBSTRATE COUPLING FOR INDUCTORS IN SEMICONDUCTOR DEVICES

PRIORITY DATA

This application is a divisional application of U.S. application Ser. No. 12/724,904, filed Mar. 16, 2010, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when the high-k metal gate, gate last process causes chemical mechanical polishing (CMP) dishing in open areas, such as areas reserved for forming inductive or other components over a silicon substrate. To reduce the dishing effect, dummy polysilicon gates may be formed in the open areas reserved for forming inductive or other components. This also causes problems because the high-k metal gate, gate last process removes the polysilicon and replaces it with a metal in the dummy gates. Having the low resistance metal in the areas reserved for inductors or other components causes an undesired coupling effect, due to induced eddy currents, between the inductive device and the substrate.

Accordingly, reduced substrate coupling for inductors in semiconductor devices is desired.

SUMMARY

In an embodiment, the present disclosure provides reduced substrate coupling for inductors in semiconductor devices. A method of fabricating a semiconductor device having reduced substrate coupling includes providing a substrate having a first region and a second region. The method also includes forming a first gate structure over the first region and a second gate structure over the second region, wherein the first and second gate structures each include a dummy gate. The method next includes forming an inter layer dielectric (ILD) over the substrate and forming a photoresist (PR) layer over the second gate structure. Then, the method includes removing the dummy gate from the first gate structure, thereby forming a trench and forming a metal gate in the trench so that a transistor may be formed in the first region, which includes a metal gate, and an inductor component may be formed over the second region, which does not include a metal gate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
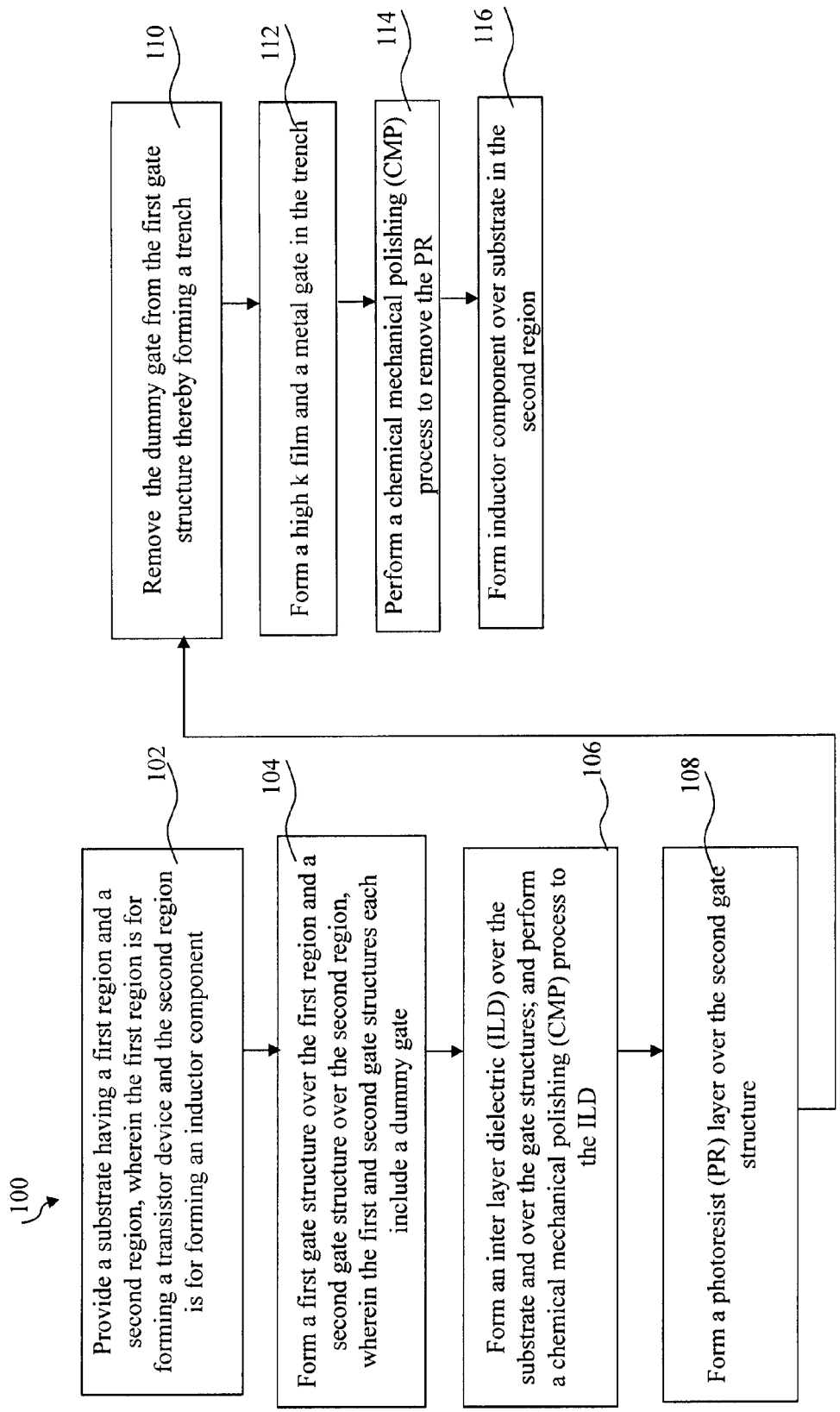
FIG. 1 is a flowchart illustrating a method for fabricating a semiconductor device with a metal gate and a reduced inductor coupling in a substrate according to various aspects of the present disclosure.

Referring to FIG. 1, illustrated is a flowchart of a method 100 for fabricating a semiconductor device with reduced inductor coupling according to various aspects of the present disclosure. Referring also to FIGS. 2A to 2D, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process (RPG)). In a gate last process, a dummy dielectric and dummy poly gate structure may be initially formed and may be followed by a normal CMOS process flow until deposition of an interlayer dielectric (ILD). The dummy dielectric and dummy poly gate structure may then be removed and replaced with a high-k gate dielectric/metal gate structure. The semiconductor device 200 is similar to the semiconductor device 300 of FIGS. 3A-3C and semiconductor device 400 of FIG. 4.

Figure 3A:
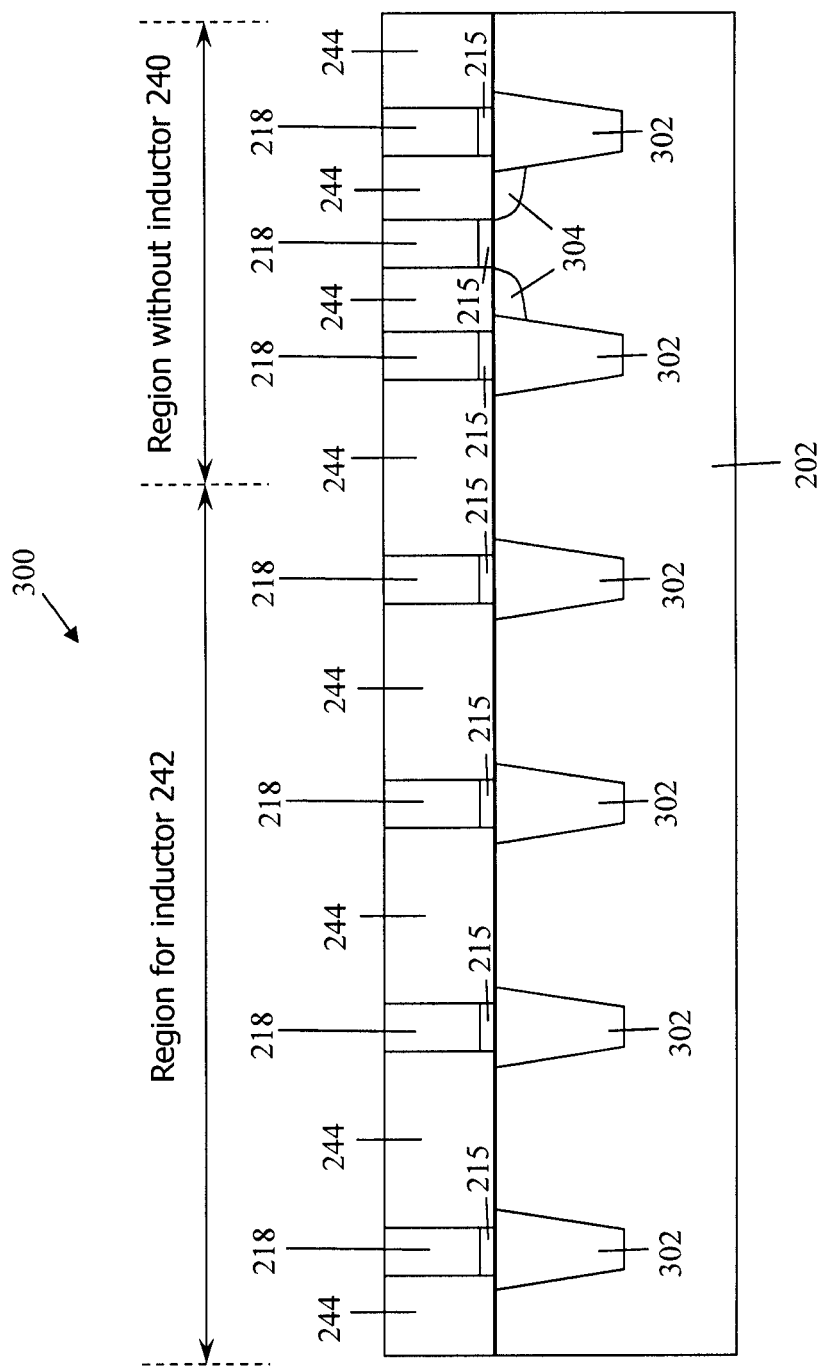
FIGS. 3A to 3C are cross-sectional views of another embodiment of a semiconductor device at various stages of fabrication according to the method of FIG. 1.
Figure 3B:
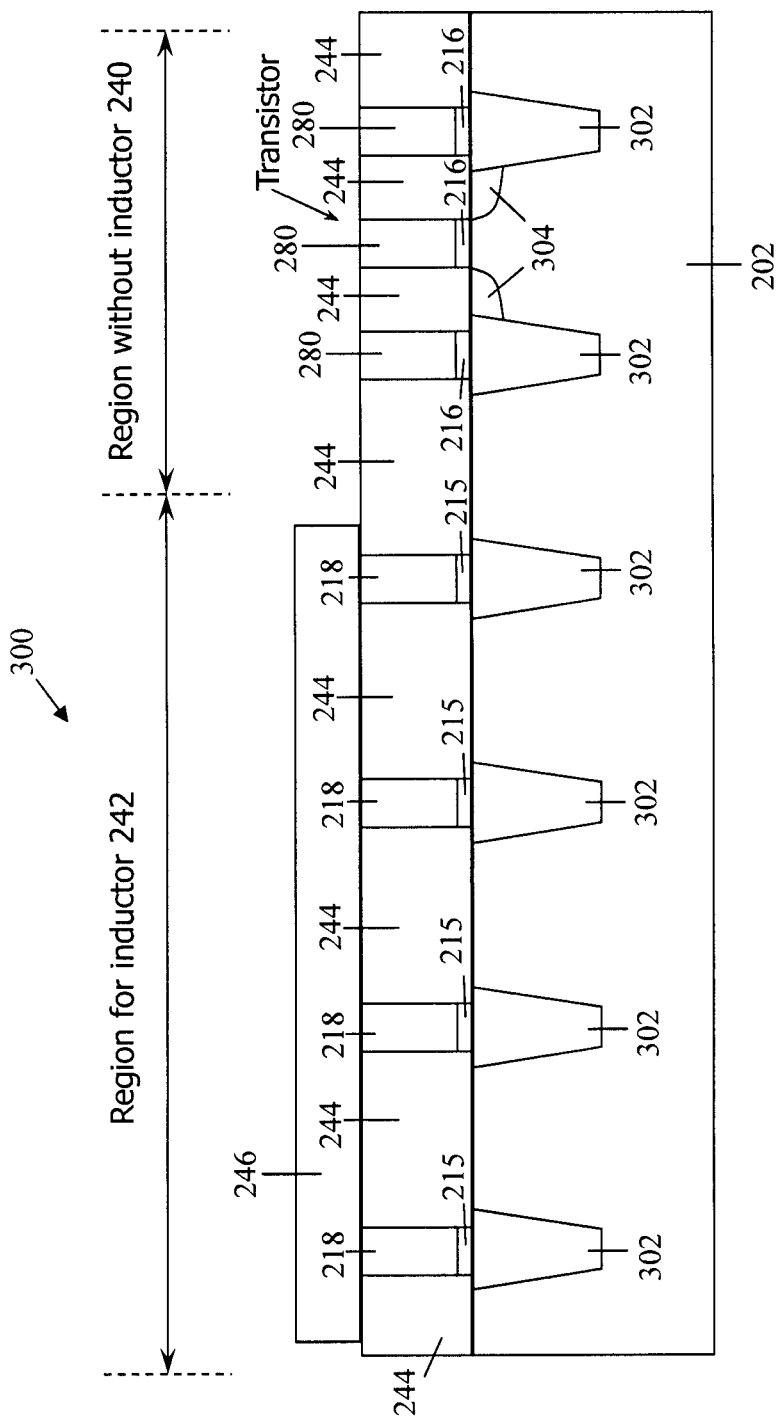
Figure 3C:
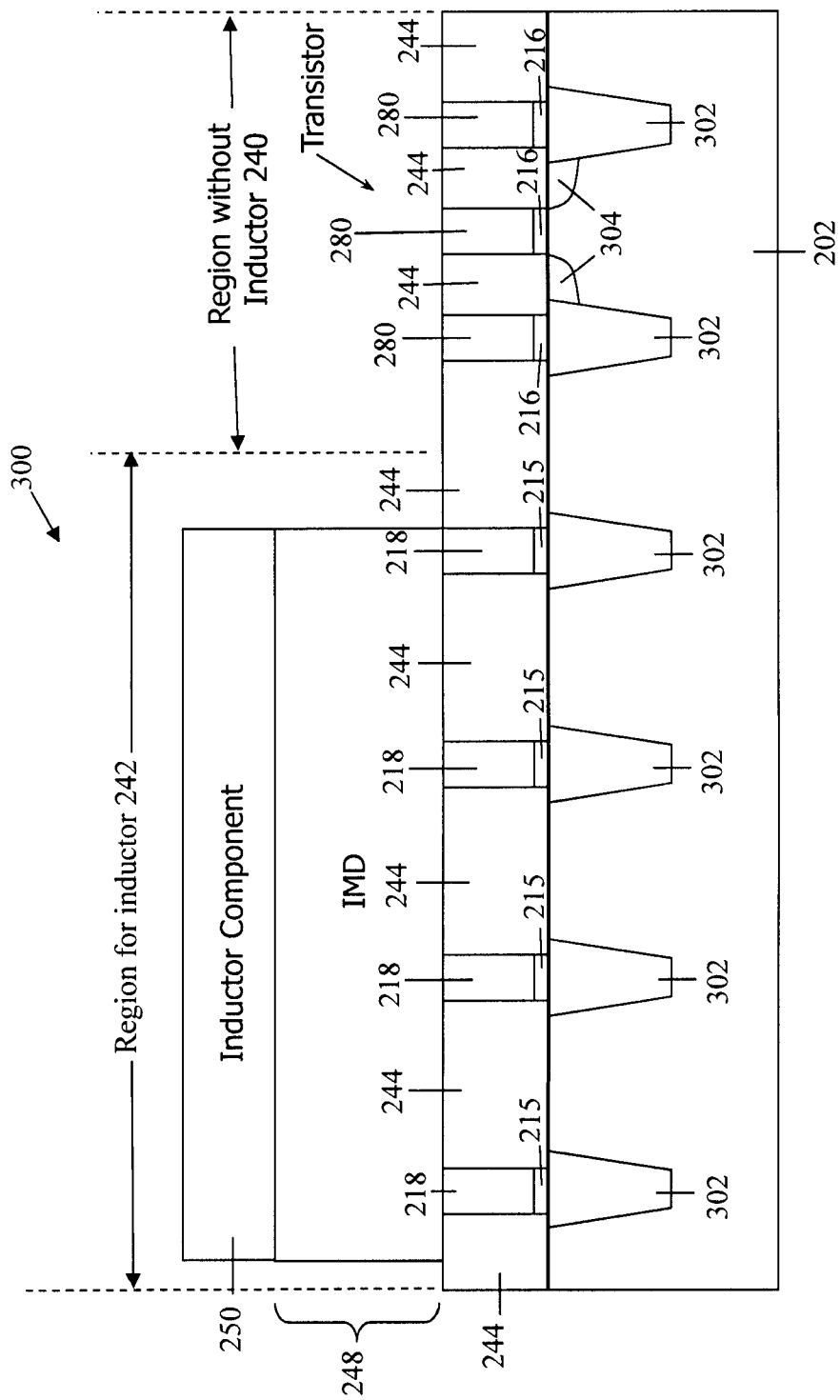
Figure 4:
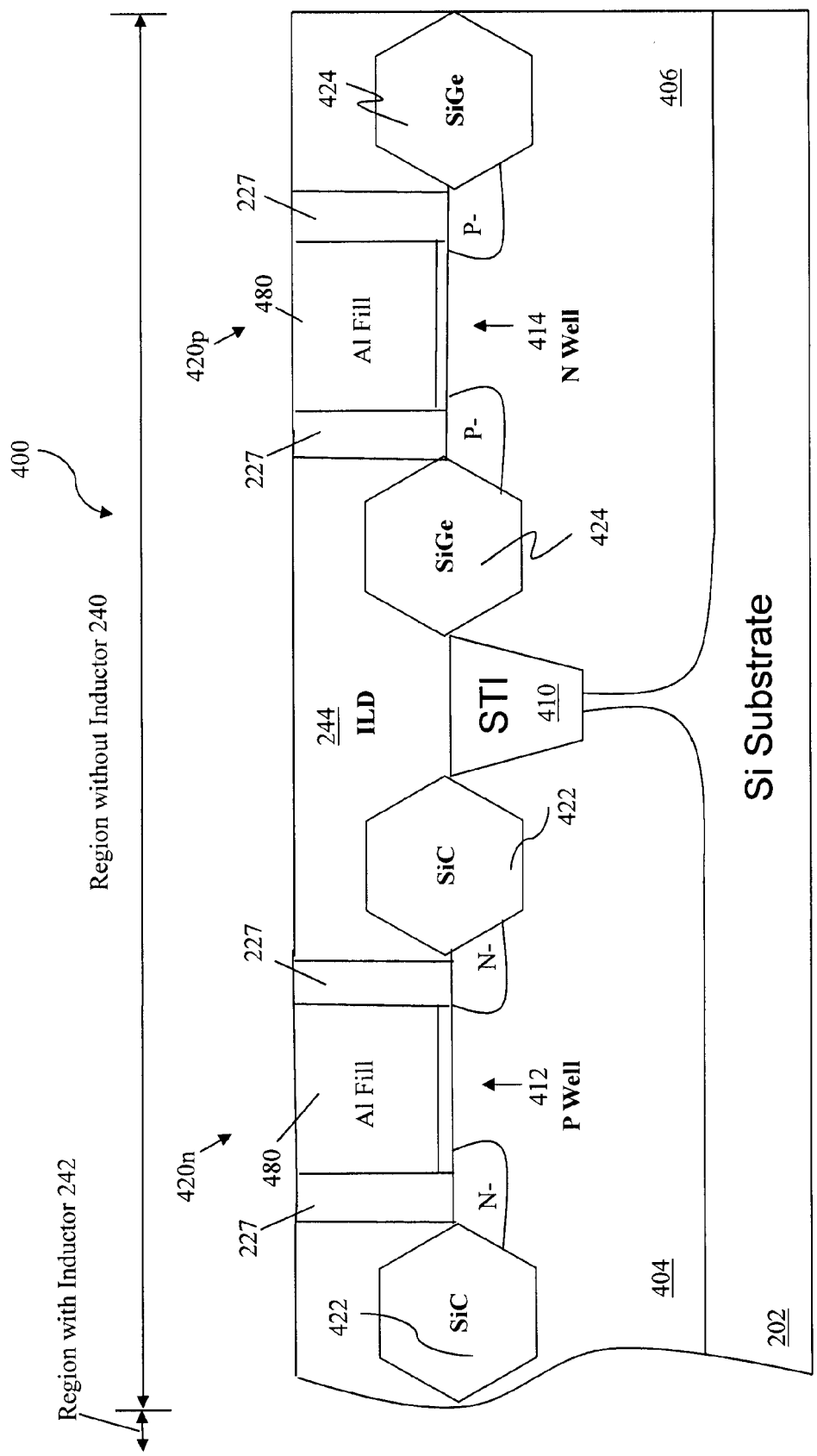
FIG. 4 is a cross-sectional view of an embodiment of a semiconductor device formed according to the method of FIG. 1.

Accordingly, similar features in FIGS. 2, 3 and 4 are numbered the same for the sake of simplicity and clarity.

Figure 2A:
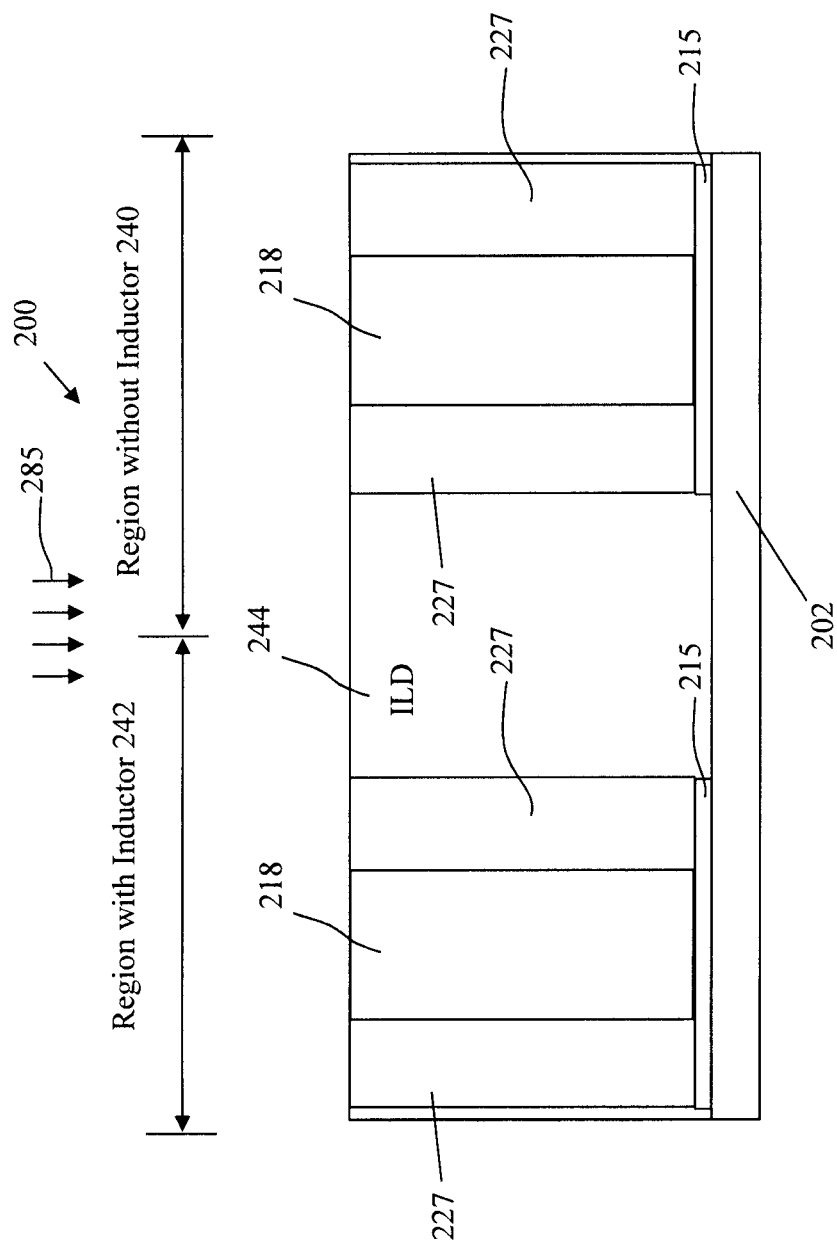
FIGS. 2A to 2D are cross-sectional views of an embodiment of a semiconductor device at various stages of fabrication according to the method of FIG. 1.

The method 100 begins with block 102 in which a semiconductor substrate is provided having a first region and a second region. In an embodiment, the first region is for forming a transistor device therein and the second region is for forming an inductor component thereover. In FIG. 2A, the semiconductor device 200 may include a semiconductor substrate 202 such as a silicon substrate having a first region (e.g., the region 240 for a transistor, and not for an inductor) and having a second region (e.g., the region 242 for an inductor or other similar device). The substrate 202 may alternatively include silicon germanium, gallium arsenic, or other suitable semiconductor materials. The substrate 202 may further include doped regions such as a P-well and/or an N-well (not shown). The substrate 202 may also further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The substrate 202 may further include doped regions such as a P-well and N-well (not shown). The active region may be configured as an NMOS device (e.g., nFET) or a PMOS device (e.g., pFET).

The method 100 continues with block 104 in which a first gate structure is formed over the first region (e.g., 240) and a second gate structure is formed over the second region (e.g., 242). The gate structures each include spacers 227 and a dummy polysilicon (or poly) layer/gate 218. The formation of the gate structures includes forming various material layers, and etching/patterning the various material layers to form a gate structure. The semiconductor device 200 may include a dummy insulator layer 215 formed over the substrate 202. In the alternative, an insulator layer including an interfacial layer, a high k dielectric layer and/or a barrier layer may be formed on the substrate 202 and left in the final device. These various layers are described in more detail below with reference to FIG. 4. The insulator layer 215 may be a dummy dielectric layer formed on the substrate 202. The dummy dielectric layer may include an oxide (e.g., thermal or chemical oxide formation). The dummy dielectric layer may include a thickness ranging from 10 to about 50 angstrom (A).

The semiconductor device 200 includes a dummy polysilicon (or poly) layer 218 formed over the insulator layer 215 by a suitable deposition process. For example, silane ($SiH_4$), di-silane ($Si_2H_6$), or di-clorsilane ($SiCl_2H_4$) may be used as a chemical gas in a CVD process to form the poly layer 218. The poly layer 218 may include a thickness ranging from about 400 to about 2000 angstrom (A). Alternatively, an amorphous silicon layer may optionally be formed instead of the polysilicon layer.

The method 100 continues with block 106 in which an inter layer dielectric (ILD) 244 is formed over the substrate 202 and over the gate structures in the regions 240 and 242. The ILD 244 may include an oxide formed by a high aspect ratio process (HARP) and/or high density plasma (HDP) CVD process. The deposition of the ILD 244 fills in the gaps between the adjacent gate structures in the regions 240 and 242. Thereafter, a chemical mechanical polishing (CMP) process 285 is performed on the ILD 244 to planarize the ILD 244 until the dummy poly gates 218 are exposed.

The method 100 proceeds to block 108 where a photoresist (PR) 246 layer is formed over the substrate 202, the spacers 227 and the dummy gate 218 in the second region 242. The semiconductor device 200 may further include a hard mask layer (not shown) formed on the poly layer 218. The hard mask layer may include silicon oxide, silicon nitride, silicon oxynitride, silicon carbide, and/or other suitable dielectric materials, and may be formed using a method such as CVD or PVD. The hard mask layer may be formed at a thickness ranging from about 100 to about 400 angstrom (A). Additionally, an antireflective coating layer or bottom antireflective coating (BARC) layer may be used to enhance a photolithography process for patterning a photoresist layer, such as that photoresist layer 246. For example, the patterned photoresist layer 246 may be formed on the hard mask layer including gate patterns. The gate patterns may then be used to pattern the hard mask layer by a dry etch or wet etch process. The patterned hard mask may then be used to form the gate structure by a dry etch, wet etch, or combination dry and wet etch process. Accordingly, the gate structure may include the insulator layer 215, the dummy poly gate 218, and a hard mask (not shown). The PR 246 layer is formed on the device 200 to protect a portion of the device 200. The patterned photoresist layer 246 may be formed by photolithography, immersion lithography, ion-beam writing, or other suitable techniques. For example, the photolithography process may include spin-coating, soft-baking, exposure, post-baking, developing, rinsing, drying, and other suitable process. After formation of the gate structure (e.g., gate etching or patterning) and after formation of the PR 246, the semiconductor device 200 may undergo additional processing (e.g., CMOS processing) to form various features as described in more detail below with respect to FIG. 4.

Figure 2B:
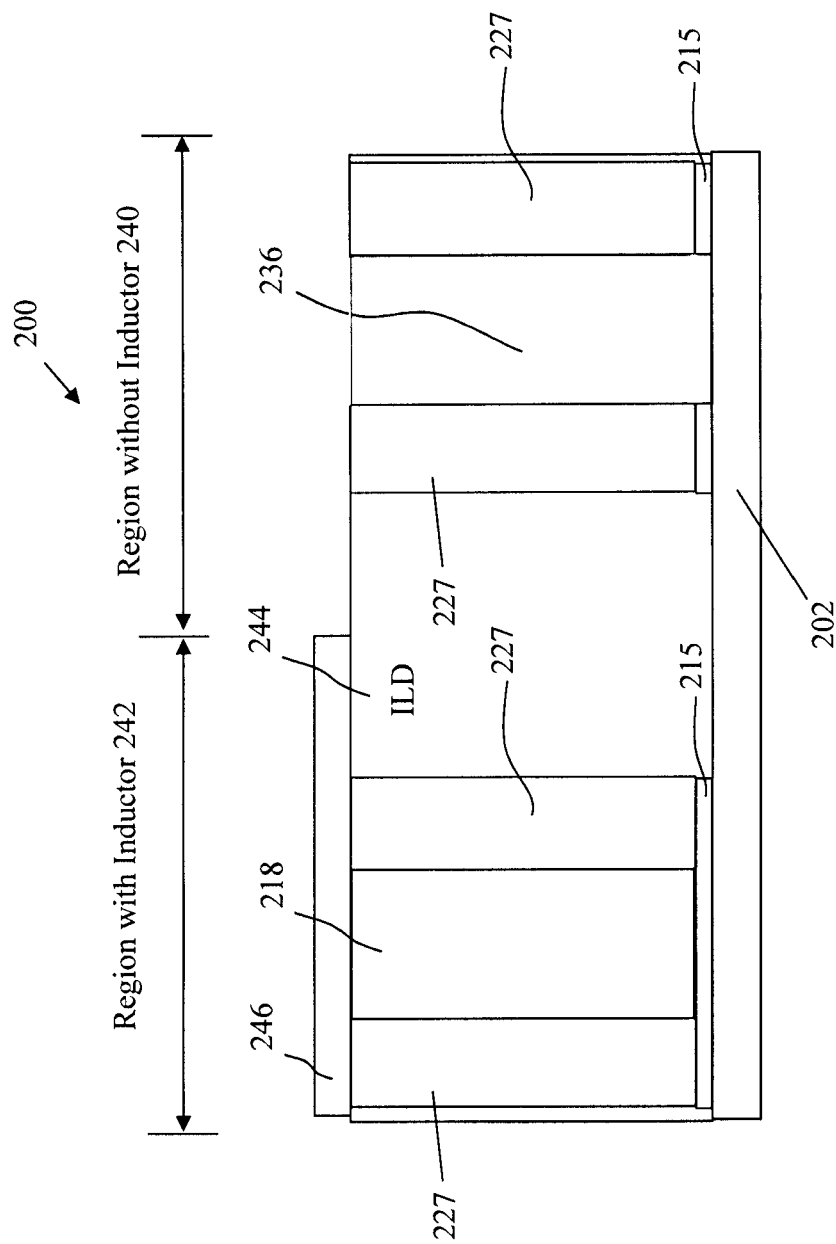

The method 100 continues with block 110 in which the dummy gate 218 is removed from the gate structure thereby forming a full trench 236 in the gate structure. In FIG. 2B, the PR 246 is formed on the device 200 in the region 242 to protect the poly gate 218 in the region 246. The dummy poly gates 218 in the gate structure may be removed by a dry etching, wet etching, or combination dry and wet etching process thereby forming a full trench 236. For example, a wet etching process may include exposure to a hydroxide containing solution (e.g., ammonium hydroxide), de-ionized water, and/or other suitable etchant solutions. Etching the poly layer 218 may be performed using HBr, CF4, Cl2, O2 or HeO2 at a temperature of about 0° C.-100° C. Accordingly, the dummy poly gate 218 may be etched down to the insulator 215 or the substrate 202, thereby forming a full trench 236 in the gate structures of the region 240. Accordingly, the region 242 will not include a metal gage and therefore, will have a very low coupling effect with inductors formed in the region 242.

The dummy poly gate 218 and dummy dielectrics 215 may be removed in a single-step etching process or multiple-step etching process. For example, a first wet etch process may be used to remove the dummy poly gate 218. The first wet etch process may include exposure to a hydroxide containing solution (e.g., ammonium hydroxide), deionized water, and/or other suitable etchant solutions. A second wet etch process may be used to remove the dummy dielectric 215. The second wet etch process may include exposure to a buffered HF solution or a buffered oxide etchant (BOE). The second wet etch process may selectively remove the dummy dielectric 215 and may stop at the substrate 202, thereby forming the full trench 236 in the gate structure. It is understood that other etching chemicals may be used for selectively removing the dummy dielectric 215 and dummy poly gate 218.

Figure 2C:
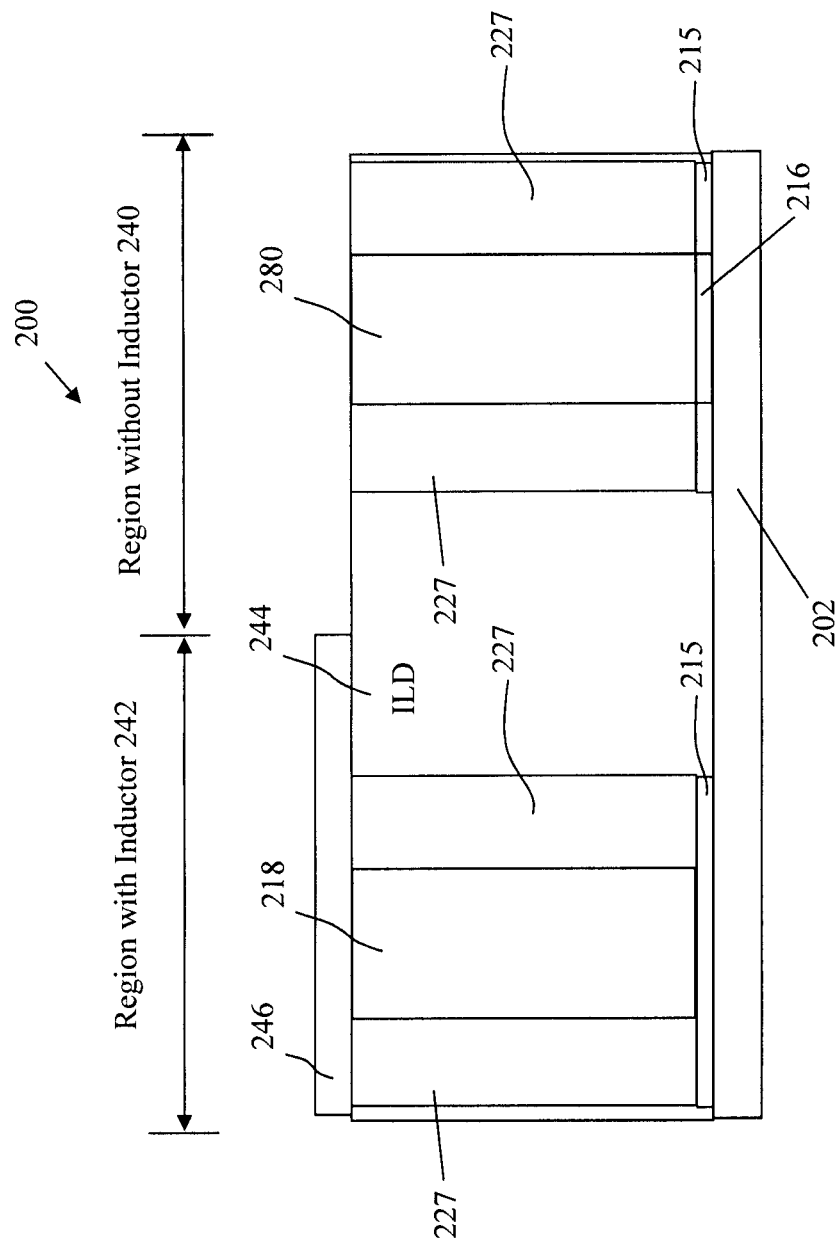

The method 100 continues with block 112 in which a high k gate film and a metal gate layer is formed to substantially fill in the trench. In FIG. 2C, a high k material layer or layers 216 is formed on the substrate 202. The high k layers may include an interfacial layer, a high-k dielectric layer, and/or a barrier layer. These layers may be similar to the layers described in more detail below with respect to FIG. 4. Additionally, a fill metal 280 is deposited to fill in the trench 236. In an embodiment, a layer of titanium (Ti) may be deposited to function as a wetting layer for a subsequent aluminum (Al) fill. The Ti layer may be formed by PVD or other suitable process. A layer of metal 280, such as Al, may be formed to fill in the trench 236. The Al layer 280 may be formed by forming a first Al layer by CVD and then forming a second Al layer by PVD. Alternatively, the fill metal 280 may optionally include tungsten (W), copper (Cu), or other suitable metal material.

Figure 2D:
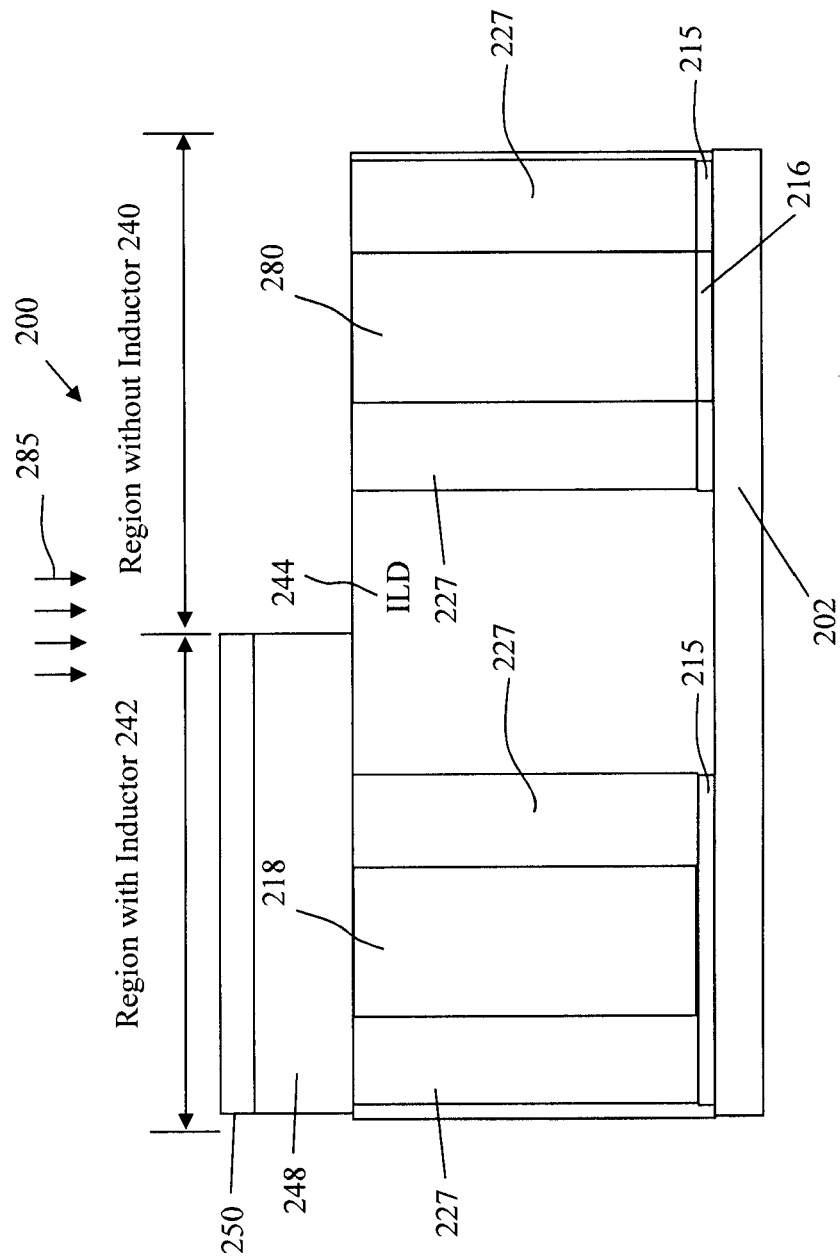

The method 100 continues with block 114 in which a chemical mechanical polishing (CMP) process is performed. In FIG. 2D, a CMP 285 is performed on the metal gate layer 280 to remove the excess metal (e.g., Al outside of the trench 236). The CMP 285 may have a high selectivity to provide a substantially planar surface for the gate structure, including removing the PR 246 in the region 242. Accordingly, the metal gate may perform a proper work function for the device 200.

The method 100 continues to block 116 where an inter metal dielectric (IMD) 248 and an inductor component device 250 are formed on the substrate 202 in the region 242, as shown in FIG. 2D. The IMD 248 may include an oxide formed by a high aspect ratio process (HARP) and/or high density plasma (HDP) CVD process. The deposition of the IMD 248 provides an insulative material between the region 242 of the device 200 and the inductor device 250. Thereafter, a chemical mechanical polishing (CMP) process may be performed on the IMD 248 to planarize the IMD 248 before forming the inductor device 250. The inductor device 250 may be formed on the IMD 248 in the region 242 in any way.

It should be readily recognized that the device 200 provides a reduced coupling effect between the inductor component device 250 and the substrate 202 by reducing the eddy currents. The present disclosure is compatible with high-k metal gate systems, processes, and devices to effectively suppress substrate coupling for inductors formed on the device 200. In an embodiment, the present disclosure provides a reduction of eddy currents when using high-R resistors, as compared to using dummy metal gate cases. The use of high-R dummy gates in the region 242 results in higher Q inductors for the HKMG systems, having dummy poly under the inductor component 250 in the region 242 for reducing CMP dishing in the region 242. Accordingly, an embodiment of the present disclosure provides no doped polysilicon or metal below the inductor device 250 in the region 242. It should be understood that the PR 246 protects the dummy poly gate 218 in the region 242 from being removed during the poly removal etching process creating the trench 236 for the metal gate 280.

It should be noted that various metal layers and any SOG layer outside of the trenches may be removed by a combination CMP and etching process. Further, the quality and integrity of the high-k dielectric layer 216 is maintained since it experiences a lower thermal cycle when formed in a gate last approach. It is understood that the semiconductor device 200 may undergo further processing to form various features such as contacts/vias, interconnect metal layers, interlayer dielectric, passivation layers, etc. It should be noted that the techniques and processes, such as lithography, etching, and high-k/metal gate formation, disclosed above with reference to FIGS. 1 and 2A-2D can also be implemented in the various embodiments disclosed below with reference to FIGS. 3A-3C and 4.

Referring now to FIGS. 3A, 3B, and 3C are cross-sectional views of an embodiment of a semiconductor device 300 at various stages of fabrication according to the method of FIG. 1. Similarly numbered features shown in FIGS. 2A-2D and 3A-3C may be formed substantially the same as that described above with respect to FIGS. 2A-2D. The device 300 includes multiple dummy gates 218 in the region 240 and multiple dummy gates 218 in the region 242. As such, the region 240 is configured to be formed as a transistor device and the region 242 is formed to receive an inductor component 250 thereupon.

In addition to the process discussed above with respect to FIGS. 2A-2D, the device 300 includes isolation structures 302, such as a shallow trench isolation (STI) or LOCOS features formed in the substrate 202 for isolating active regions 304 from other regions of the substrate 202. The active regions 304 may be configured as an NMOS device (e.g., nFET) or as a PMOS device (e.g., pFET).

As should be understood, the plurality of dummy gates 218 in the inductor region 242 will reduce dishing in the region 242 during CMP processing of the device 300. Additionally, the dummy poly silicon 218, as opposed to the metal gate 280 in the inductor region 242 will significantly reduce eddy current coupling between the inductor component 250 and the substrate 202. In other words, there is little to no low-resistance metal between the inductor component 250 and the substrate 202 that would support inductive coupling. This may be accomplished using the PR 246 over the dummy poly gates 218 in the region 242 when the poly gates 218 are being removed from the transistor region 240.

Referring now to FIG. 4, illustrated is a cross-sectional view of an embodiment of a portion of a semiconductor device 400 (e.g., only the region 240 without the inductor) formed according to the method of FIG. 1. The portion 242, that is not shown in FIG. 4, may be formed substantially the same as region 242 described above with respect to FIGS. 2A-2D and 3A-3C.

It should be noted that part of the semiconductor device 400 may be fabricated with a CMOS process flow. Accordingly, it is understood that additional processes may be provided before, during, and after, and that some other processes may only be briefly described herein. The semiconductor device 400 may be fabricated in a gate last process. The semiconductor device 400 is similar to the device 200 of FIGS. 2A-2D and also similar to the device 300 of FIGS. 3A-3C. Accordingly, similar features in FIGS. 2, 3 and 4 may be formed substantially the same and are numbered the same for the sake of simplicity and clarity.

In an embodiment, formation of the device 400 begins when a semiconductor substrate is provided. In FIG. 4, the semiconductor device 400 includes a semiconductor substrate 202, such as a silicon substrate. The substrate 202 further includes doped regions, such as a P-well 404 and N-well 406. The semiconductor device 400 may further include an isolation structure 410, such as a shallow trench isolation (STI) or LOCOS feature formed in the substrate 202 for isolating active regions 412 and 414 of the substrate 202. The active region 412 may be configured for an NMOS device (e.g., nFET) and the active region 414 may be configured for a PMOS device (e.g., pFET).

The formation of the device 400 continues wherein first and second gate structures are formed. The gate structures include spacers 227 and a dummy polysilicon (or poly) layer/gate (e.g., similar to dummy polysilicon gate 218 shown in FIGS. 2 and 3, shown as previously removed in FIG. 4). The formation of the gate structures includes forming various material layers, and etching/patterning the various material layers to form a gate structure in the nFET 412 device side and a gate structure in the pFET 414 device side as discussed below.

The semiconductor device 400 may include an interfacial layer formed over the substrate 202 in the channel between the spacers 227. The interfacial layer may include a silicon oxide ($SiO_2$) layer (e.g., thermal or chemical oxide formation) having a thickness ranging from about 5 to about 20 angstrom (A). Alternatively, the interfacial layer may optionally include HfSiO or SiON formed by atomic layer deposition (ALD), chemical vapor deposition (CVD), physical vapor deposition (PVD), thermal oxidation, or combinations thereof. In some embodiments, an Hf film may be formed on a thermal oxide by ALD, CVD, or PVD, and then oxidized by thermal $O_2$ to form HfSiO. In other embodiments, an Hf film may be formed by ALD, CVD, or PVD in a reactive $O_2$ ambient.

The semiconductor device 400 may further include a high-k dielectric layer formed on the interfacial layer. The high-k dielectric layer may be formed by ALD, CVD, metalorganic CVD (MOCVD), PVD, thermal oxidation, combinations thereof, or other suitable techniques. The high-k dielectric layer may include a thickness ranging from about 5 to about 20 angstrom (A). The high-k dielectric layer may include a binary or ternary high-k film such as $HfO_x$. Alternatively, the high-k dielectric layer may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HMO, HfTiO, $(Ba,Sr)TiO_3$ (BST), $Al_2O_3$, $Si_3N_4$, oxynitrides, or other suitable materials. A post high-k deposition anneal may be performed in some embodiments.

The semiconductor device 400 may further include a barrier layer formed over the high-k dielectric layer. The barrier layer may include a metal film such as TiN or TaN. Alternatively, the barrier layer may optionally include $Si_3N_4$. The barrier layer may include a thickness ranging from about 5 to about 20 angstrom (A). The barrier layer may function as a barrier between the high-k dielectric layer and a subsequent dummy poly gate structure. The barrier layer may help reduce or eliminate the risk of Fermi level pinning between the poly and the high-k dielectric during subsequent processing. Also, the barrier layer may function as a etch stop layer and protection layer during removal of the dummy poly gate as discussed later below. The barrier layer may be formed by various deposition techniques such as ALD, PVD, CVD, or other suitable technique. It should be noted that the interfacial layer, high-k dielectric, and barrier layer may be alternatively formed in a gate last process.

The semiconductor device 400 may further include the polysilicon (or poly) layer 218 formed over the barrier layer by a suitable deposition process. For example, silane ($SiH_4$), di-silane ($Si_2H_6$), or di-clorsilane ($SiCl_2H_4$) may be used as a chemical gas in a CVD process to form the poly layer 218. In an embodiment, the poly layer 218 may include a thickness ranging from about 400 to about 2000 angstrom (A). Alternatively, an amorphous silicon layer may optionally be formed instead of the polysilicon layer. The semiconductor device 400 may further include a hard mask layer formed on the poly layer 218. The hard mask layer may include silicon oxide, silicon nitride, silicon oxynitride, silicon carbide, and/or other suitable dielectric materials, and may be formed using a method such as CVD or PVD. The hard mask layer may include a thickness ranging from about 100 to about 400 angstrom (A). Additionally, an antireflective coating layer or bottom antireflective coating (BARC) layer may be used to enhance a photolithography process for patterning a photoresist layer. For example, a patterned photoresist layer (not shown) (e.g., 246, shown in FIGS. 2 and 3) may be formed on the hard mask layer including a gate pattern overlying the nFET 412 device side and a gate pattern overlying the pFET 414 device side. The gate patterns may be used to pattern the hard mask layer by a dry etch or wet etch process.

The patterned hard mask may then be used to form the gate structure 420n in the nFET 412 device side and a gate structure 420p in the pFET 414 device side by a dry etch, wet etch, or combination dry and wet etch process. Accordingly, the gate structures 420n, 420p may each include an interfacial layer, high-k dielectric layer, a barrier layer, a dummy poly gate 218, and/or a hard mask.

After formation of the gate structures 420n, 420p (e.g., gate etching or patterning), it is understood that the semiconductor device 400 may undergo additional CMOS processing to form various features of the nFET 412 and pFET 414. Accordingly, the various features are only briefly discussed herein. The various features may include SiC features 422 in the nFET 412 side, SiGe 424 features in the pFET 414 side, lightly doped source/drain regions (n-type and p-type LDD regions), sidewall or gate spacers 227, source/drain (S/D) regions (n-type and p-type S/D regions), silicide features, contact etch stop layer (CESL), and an interlayer dielectric (ILD) 244. It should be noted that the SiC features 422 and SiGe features 424 are optional, and that a strained layer may be implemented for the nFET 412 device and/or the pFET 414 device to boost the performance of the device. The ILD 244 may include an oxide formed by a high aspect ratio process (HARP) and/or high density plasma (HDP) CVD process. The deposition of the ILD 244 fills in the gaps between the adjacent gate structures 420n, 420p of the nFET 412 and pFET 414 devices, respectively. Thereafter, a chemical mechanical polishing (CMP) process may be performed on the ILD 244 to remove the PR and to planarize the ILD 244 until the dummy poly gates 218 are exposed in the nFET 412 side and pFET 414 side, respectively.

Fabricating the device 400 continues where the dummy gates (e.g., 218 shown in FIGS. 2-3) are removed from the resion 240, thereby forming trenches in the gate structures. Then, a patterned photoresist layer (not shown) may be formed on the device 400 to protect a portion of the device 400, such as one or more of the gate structures. The patterned photoresist layer may be formed by photolithography, immersion lithography, ion-beam writing, or other suitable techniques. For example, the photolithography process may include spin-coating, soft-baking, exposure, post-baking, developing, rinsing, drying, and other suitable process. In the un protected gate structures, the dummy poly gates may be removed by a dry etching, wet etching, or combination dry and wet etching process. For example, a wet etching process may include exposure to a hydroxide containing solution (e.g., ammonium hydroxide), de-ionized water, and/or other suitable etchant solutions. Etching the poly layer 218 may be performed using HBr, CF4, Cl2, O2 or HeO2 at a temperature of about 0° C.-100° C. The etching process may be stopped after a time period so that a portion (e.g., ~400 angstroms) of the dummy poly gates 218 remains. Any suitable process may be used to stop the etch process. Accordingly, the dummy poly gate 218 may be etched away, thereby forming trenches in the gate structures. Any applied patterned photoresist layer (not shown) may be removed by stripping or other suitable process.

Formation of the device 400 continues with a high k gate film and a metal layer being formed to fill the trenches of the gate structures. A high k material (if not already formed on the substrate 202) may be formed on the substrate 202 in the trenches. Additionally, a fill metal 480 may be deposited to fill or substantially fill the trenches. In the present embodiment, a layer of titanium (Ti) may be deposited to function as a wetting layer for a subsequent aluminum (Al) fill. The Ti layer may be formed by PVD or other suitable process. A layer of Al 480 may be formed to fill in the trenches 236. The Al layer 480 may be formed by forming a first Al layer by CVD and then forming a second Al layer by PVD. Alternatively, the fill metal 480 may optionally include tungsten (W), copper (Cu), or other suitable metal material.

A chemical mechanical polishing (CMP) process may be performed on the device 400 to remove the PR and/or any excess metal 480 (e.g., the Al outside of the trenches). The CMP process may have a high selectivity to provide a substantially planar surface for the gate structures and the ILD layer 244. Accordingly, the metal gate (including an N-metal layer (not shown) and Al fill layer 480) of the nFET 412 may perform the proper N work function and the metal gate (including a P-metal layer (not shown) and Al fill layer 480) of the pFET 414 may perform the proper P work function. Thus, the desired threshold voltages of the nFET 412 and pFET 414, respectively, may be achieved without added complexity.

It is understood that the semiconductor device 400 may undergo further processing to form various features such as contacts/vias, interconnect metal layers, interlayer dielectric, passivation layers, inductors (e.g., inductor component 250), capacitors, etc. It should be noted that the techniques and processes disclosed with reference to FIG. 4 can also be implemented in the embodiments of FIGS. 1, 2A-2D, and 3A-3C, disclosed above.

The present invention achieves different advantages in various embodiments disclosed herein. It is understood that different embodiments disclosed herein offer several different advantages, and that no particular advantage is necessarily required for all embodiments. For example, the present disclosed method provides a simple and cost-effective method for forming high-k gate dielectric in a gate last process using a dummy dielectric. As another example, the presently disclosed methods provide for reduced inductor coupling with a substrate due to eddy currents because there is little or no low resistance metal between an inductor and the substrate. Moreover, the present disclosed method provides a simple and cost-effective method for forming metal gates with proper work functions for nFET and pFET devices in a gate last process. Further, the methods and devices disclosed herein may easily be integrated with current CMOS process flow and semiconductor processing equipment. For example, the methods disclosed herein implement materials and processes that are friendly and compatible with the CMOS process flow and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
substrate having a first region and a second region;
first gate structure formed over the first region, wherein the first gate structure includes a metal gate;
a second gate structure formed over the second region, wherein the second gate structure includes non-metal dummy gate;
an inter layer dielectric (ILD) layer formed over the substrate;
an inductor component formed directly over the second gate structure in the second region; and
an inter metal dielectric (IMD) layer extending from the inductor component to the second gate structure in the second region, wherein the first region is free of the IMD layer.

2. The semiconductor device of claim 1, further comprising:
a transistor device formed in the first region.

3. The semiconductor device of claim 1, wherein the dummy gate is formed of polysilicon.

4. The semiconductor device of claim 1, wherein the ILD is planarized using a chemical mechanical polishing (CMP) process.

5. The semiconductor device of claim 1, further comprising:
a high k film formed between the substrate and the metal gate.

6. The semiconductor device of claim 1, further comprising:
a shallow trench isolation feature formed in the substrate in the second region below the second gate structure.

7. The device of claim 1, wherein the IMD layer is formed over and physically contacting the ILD layer.

8. A device comprising:
a first gate stack formed over a first region of a semiconductor substrate, wherein the first gate stack includes an undoped polysilicon gate;
a second gate stack formed over a second region of the semiconductor substrate, wherein the second gate stack includes a metal gate;
an interlayer dielectric layer disposed between the first and second gate stacks;
an inter metal dielectric layer disposed over and physically contacting the first gate stack in the first region of the semiconductor substrate; and
an inductor component disposed over and physically contacting the inter metal dielectric layer in the first region of the semiconductor substrate.

9. The device of claim 8, wherein the inter metal dielectric layer physically contacts the undoped polysilicon gate.

10. The device of claim 8, further comprising an isolation feature disposed within the first region of the semiconductor substrate, and
wherein the isolation feature is disposed within the semiconductor substrate directly under the first gate stack.

11. The device of claim 8, wherein the inductor component physically contacts the inter metal dielectric layer.

12. The device of claim 8, wherein the second region of the substrate is without the inter metal dielectric layer being disposed thereover.

13. The device of claim 8, wherein the second region of the substrate is without the inductor component being disposed thereover.

14. The device of claim 8, further comprising a first sidewall spacer disposed on a first sidewall of the first gate stack and a second sidewall spacer disposed on a second sidewall of the second gate stack, and wherein the interlayer dielectric layer extends from the first sidewall spacer to the second sidewall spacer.

15. A device comprising:
a first gate stack formed over a first region of a semiconductor substrate, wherein the first gate stack includes a non-metal gate;
a second gate stack formed over a second region of the semiconductor substrate, wherein the second gate stack includes a metal gate;
an interlayer dielectric layer disposed between the first and second gate stacks;
an inter metal dielectric layer disposed over and physically contacting the first gate stack in the first region; and
an inductor component disposed over and physically contacting the inter metal dielectric layer in the first region.

16. The device of claim 15, wherein the second region of the substrate is without the inter metal dielectric layer being disposed thereover, and wherein the second region of the substrate is without the inductor component being disposed thereover.

17. The device of claim 15, wherein the non-metal gate includes an undoped polysilicon gate.

18. The device of claim 15, further comprising a shallow trench isolation feature disposed within the first region of the semiconductor substrate, and wherein the first gate stack includes a dielectric layer that physically contacts the shallow trench isolation feature.

19. The device of claim 15, further comprising a raised source/drain feature disposed within the semiconductor substrate adjacent the second gate stack, and wherein the raised source/drain feature includes one of SiGe and SiC.

20. The device of claim 15, wherein a top surface of a metal layer of the metal gate is substantially coplanar with a top surface of the interlayer dielectric layer.

* * * * *